(12) United States Patent
Ohshita et al.

(10) Patent No.: US 12,136,535 B2
(45) Date of Patent: Nov. 5, 2024

(54) PLASMA PROCESSING APPARATUS AND PLASMA PROCESSING METHOD

(71) Applicant: Tokyo Electron Limited, Tokyo (JP)

(72) Inventors: Tatsuro Ohshita, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 362 days.

(21) Appl. No.: 17/519,596

(22) Filed: Nov. 5, 2021

(65) Prior Publication Data

US 2022/0139672 A1    May 5, 2022

(30) Foreign Application Priority Data

Nov. 5, 2020   (JP) ................................ 2020-185140
Sep. 14, 2021   (JP) ................................ 2021-149309

(51) Int. Cl.
    *H01J 37/32*        (2006.01)
    *H03H 7/38*         (2006.01)

(52) U.S. Cl.
    CPC .. *H01J 37/32146* (2013.01); *H01J 37/32174* (2013.01); *H01J 37/32706* (2013.01); *H03H 7/38* (2013.01)

(58) Field of Classification Search
    CPC ........... H01J 37/32146; H01J 37/32174; H01J 37/32706; H01J 37/32532; H01J 37/32715; H01J 37/32183; H03H 7/38
See application file for complete search history.

(56) References Cited

U.S. PATENT DOCUMENTS

| | | | |
|---|---|---|---|
| 8,133,359 B2 | 3/2012 | Nauman et al. | |
| 2014/0361690 A1* | 12/2014 | Yamada | H01J 37/32183 |
| | | | 315/111.21 |
| 2021/0050183 A1* | 2/2021 | Ventzek | H01J 37/32146 |
| 2021/0335578 A1* | 10/2021 | Nagami | H01J 37/32715 |
| 2022/0020567 A1* | 1/2022 | Koshimizu | H01J 37/32146 |
| 2022/0139672 A1* | 5/2022 | Ohshita | H01J 37/32706 |
| | | | 216/67 |

FOREIGN PATENT DOCUMENTS

| | | | | |
|---|---|---|---|---|
| CN | 113571403 A | * | 10/2021 | ........ H01J 37/32009 |
| CN | 114446753 A | * | 5/2022 | ........ H01J 37/32146 |
| JP | 2009-187975 A | | 8/2009 | |

(Continued)

*Primary Examiner* — Jeffrie R Lund
(74) *Attorney, Agent, or Firm* — XSENSUS LLP (57) ABSTRACT

There is a plasma processing apparatus comprising: a chamber; a substrate support provided in the chamber, the substrate support including a bias electrode; a plasma generator configured to generate plasma from a gas in the chamber; and a bias power supply electrically connected to the bias electrode and configured to generate a sequence of a plurality of voltage pulses applied to the bias electrode, wherein each of the plurality of voltage pulses has a leading edge period in which the voltage pulse transitions from a reference voltage level to a pulse voltage level and a trailing edge period in which the voltage pulse transitions from the pulse voltage level to the reference voltage level, and at least one of a time length of the leading edge period and a time length of the trailing edge period is greater than 0 seconds and less than or equal to 0.5 microseconds.

16 Claims, 8 Drawing Sheets

(56) References Cited

FOREIGN PATENT DOCUMENTS

| | | | | |
|---|---|---|---|---|
| JP | 2022075506 A | * | 5/2022 | ........ H01J 37/32146 |
| KR | 1361217 B1 | | 2/2014 | |
| KR | 20160100840 A | | 8/2016 | |
| KR | 20170101779 A | | 9/2017 | |
| KR | 20180012060 A | | 2/2018 | |
| KR | 20190129745 A | | 11/2019 | |
| KR | 20200118788 A | | 10/2020 | |
| KR | 20220061013 A | * | 5/2022 | |
| TW | 202025218 A | * | 7/2020 | ....... C23C 16/45536 |

* cited by examiner

PLASMA PROCESSING APPARATUS AND PLASMA PROCESSING METHOD

CROSS-REFERENCE TO RELATED APPLICATIONS

This application claims priority to Japanese Patent Application Nos. 2020-185140 filed on Nov. 5, 2020 and 2021-149309 filed on Sep. 14, 2021, respectively, the entire contents of which are incorporated herein by reference.

TECHNICAL FIELD

Exemplary embodiments of the present disclosure relate to a plasma processing apparatus and a plasma processing method.

BACKGROUND

Plasma processing apparatuses are used for performing a plasma process on substrates. The plasma processing apparatus includes a chamber and a substrate holding electrode. The substrate holding electrode is provided in the chamber. The substrate holding electrode holds a substrate placed on a main surface thereof. One type of such plasma processing apparatuses is disclosed in Japanese Patent Application Publication No. 2009-187975 (hereinafter, referred to as "Patent Document 1").

The plasma processing apparatus disclosed in Patent Document 1 further includes a high-frequency generator and a direct current (DC) negative pulse generator. The high-frequency generator applies a high-frequency voltage to a substrate holding electrode in the plasma processing apparatus disclosed in Patent Document 1, the high-frequency voltage is alternately switched on and off. In addition, in the plasma processing apparatus disclosed in Patent Document 1, a DC negative pulse voltage is applied from the DC negative pulse generator to the substrate holding electrode according to an on/off timing of the high-frequency voltage.

SUMMARY

The present disclosure provides a technique for controlling the energy of ions colliding with a substrate by a voltage pulse applied to a bias electrode.

In accordance with an aspect of the present disclosure, there is a plasma processing apparatus comprising: a chamber; a substrate support provided in the chamber, the substrate support including a bias electrode; a plasma generator configured to generate plasma from a gas in the chamber; and a bias power supply electrically connected to the bias electrode and configured to generate a sequence of a plurality of voltage pulses applied to the bias electrode, wherein each of the plurality of voltage pulses has a leading edge period in which the voltage pulse transitions from a reference voltage level to a pulse voltage level and a trailing edge period in which the voltage pulse transitions from the pulse voltage level to the reference voltage level, and at least one of a time length of the leading edge period and a time length of the trailing edge period is greater than 0 seconds and less than or equal to 0.5 microseconds.

DETAILED DESCRIPTION

Hereinafter, various exemplary embodiments will be described.

In one exemplary embodiment, a plasma processing apparatus is provided. The plasma processing apparatus includes a chamber, a substrate support, a plasma generator, and a bias power supply. The substrate support includes a bias electrode and is provided in the chamber. The plasma generator is configured to generate plasma from a gas in the chamber. The bias power supply is electrically connected to the bias electrode and is configured to generate a sequence of a plurality of voltage pulses applied to the bias electrode. Each of the plurality of voltage pulses has a leading edge period in which the voltage pulse transitions from a reference voltage level to a pulse voltage level and a trailing edge period in which the voltage pulse transitions from the pulse voltage level to the reference voltage level. At least one of a time length of the leading edge period and a time length of the trailing edge period is greater than 0 seconds and less than or equal to 0.25 microseconds.

When the voltage pulse applied to the bias electrode is a perfect rectangular pulse, it is possible to control the energy of ions colliding with a substrate, but for that reason, costs become high. According to a negative voltage pulse having at least one of the leading edge period and the trailing edge period described above, it is possible to control the energy of ions colliding with the substrate as in the case of using a perfect rectangular pulse.

In one exemplary embodiment, at least one of the time length of the leading edge period and the time length of the trailing edge period may be greater than 0 seconds and less than or equal to 0.25 microseconds. In one exemplary embodiment, at least one of the time length of the leading edge period and the time length of the trailing edge period may be greater than or equal to 0.05 microseconds.

In one exemplary embodiment, the pulse voltage level may be greater than or equal to $-20$ kV and less than or equal to $-0.5$ kV. In one exemplary embodiment, the reference voltage level may be 0 V.

In one exemplary embodiment, the bias power supply may be configured to periodically apply the plurality of voltage pulses to the bias electrode.

In one exemplary embodiment, the bias power supply may include a direct current (DC) power supply and a pulse unit. The pulse unit is provided between the DC power supply and the bias electrode. The pulse unit includes a first switching element, a second switching element, and an impedance circuit. The first switching element and the second switching element are connected in series between a positive electrode and a negative electrode of the DC power supply. The impedance circuit is connected between a node, which is disposed between the first switching element and the second switching element, and the bias electrode.

In one exemplary embodiment, the plasma processing apparatus may further include a pulse controller configured to control the pulse unit. The pulse controller is configured to alternately perform a first control that closes the first switching element and opens the second switching element and a second control that opens the first switching element and closes the second switching element.

In one exemplary embodiment, the impedance circuit may include an inductor and a resistor element connected in series between the node and the bias electrode.

In one exemplary embodiment, the plasma generator may include a high-frequency power supply.

In another exemplary embodiment, a plasma processing method is provided. The plasma processing method includes providing a substrate on a substrate support in a chamber of a plasma processing apparatus. The plasma processing method further includes generating plasma in the chamber. The plasma processing method further includes applying a sequence of a plurality of voltage pulses to the substrate support in a state in which the plasma is generated in the chamber. Each of the plurality of voltage pulses has a leading edge period in which the voltage pulse transitions from a reference voltage level to a pulse voltage level and a trailing edge period in which the voltage pulse transitions from the pulse voltage level to the reference voltage level. At least one of a time length of the leading edge period and a time length of the trailing edge period is greater than 0 seconds and less than or equal to 0.25 microseconds.

In still another exemplary embodiment, a plasma processing apparatus is provided. The plasma processing apparatus includes a chamber, a substrate support, a plasma generator, and a bias power supply. The substrate support includes a bias electrode and is provided in the chamber. The plasma generator is configured to generate plasma from a gas in the chamber. The bias power supply is electrically connected to the bias electrode and is configured to generate a sequence of a plurality of voltage pulses. The bias power supply includes a DC power supply and a pulse unit. The pulse unit is provided between the DC power supply and the bias electrode. The pulse unit includes a first switching element, a second switching element, and an impedance circuit. The first switching element and the second switching element are connected in series between a positive electrode and a negative electrode of the DC power supply. The impedance circuit is connected between a node, which is disposed between the first switching element and the second switching element, and the bias electrode.

In one exemplary embodiment, the plasma processing apparatus may further include a pulse controller configured to control the pulse unit. The pulse controller is configured to alternately perform a first control that closes the first switching element and opens the second switching element and a second control that opens the first switching element and closes the second switching element.

In one exemplary embodiment, the impedance circuit may include an inductor and a resistor element connected in series between the node and the bias electrode.

Hereinafter, various exemplary embodiments will be described in detail with reference to the accompanying drawings. In addition, the same or corresponding parts will be denoted with the same reference numerals in each drawing.

Figure 1:
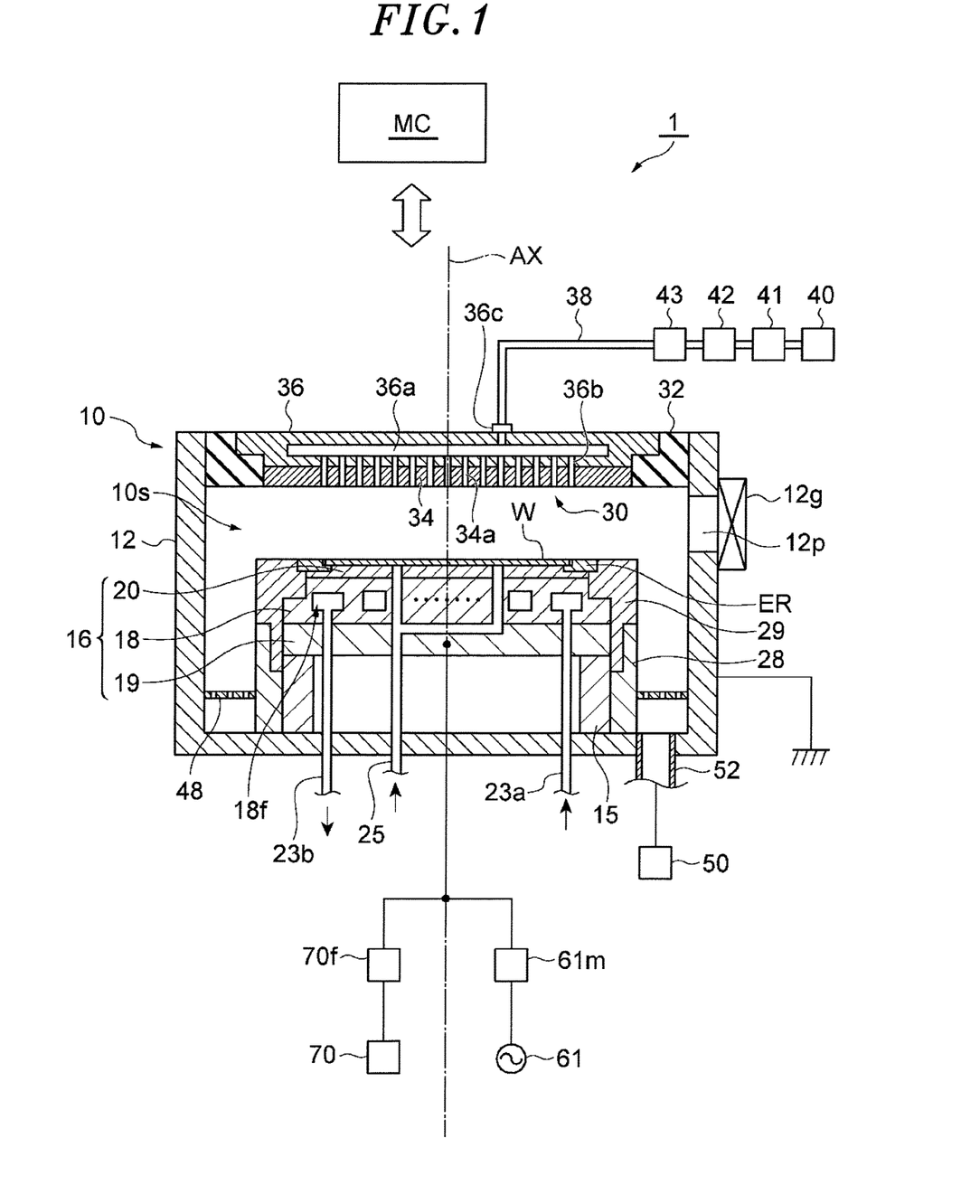
FIG. 1 is a schematic diagram illustrating a plasma processing apparatus according to one exemplary embodiment.

FIG. 1 is a schematic diagram illustrating a plasma processing apparatus according to one exemplary embodiment. A plasma processing apparatus 1 shown in FIG. 1 is a capacitively coupled plasma processing apparatus. The plasma processing apparatus 1 includes a chamber 10. An interior space 10s is formed in the chamber 10. A central axis of the chamber 10 is an axis AX and vertically extends.

In one exemplary embodiment, the chamber 10 may include a chamber main body 12. The chamber main body 12 has a substantially cylindrical shape. The interior space 10s is formed in the chamber main body 12. The chamber main body 12 is made of, for example, aluminum. The chamber main body 12 is electrically grounded. A plasma-resistant film may be formed on an inner wall surface of the chamber main body 12, that is, a wall surface that defines the interior space 10s. The film may be a ceramic film such as a film formed through anodizing treatment or a film made of yttrium oxide.

A passage 12p may be formed in a sidewall of the chamber main body 12. A substrate W passes through the passage 12p when being transferred between the interior space 10s and the outside of the chamber 10. A gate valve 12g is provided along the sidewall of the chamber main body 12 so as to open or close the passage 12p.

The plasma processing apparatus 1 further includes a substrate support 16. The substrate support 16 is configured to support the substrate W placed thereon in the chamber 10. The substrate W has a substantially disk shape. The substrate support 16 may be supported by a support 15. The support 15 extends upward from a bottom of the chamber main body 12. The support 15 has a substantially cylindrical shape. The support is made of an insulating material such as quartz.

The substrate support 16 includes a lower electrode 18. The substrate support 16 may further include an electrostatic chuck 20. The substrate support 16 may further include an electrode plate 19. The electrode plate 19 is made of a conductive material such as aluminum and has a substantially disk shape. The lower electrode 18 is provided on the electrode plate 19. The lower electrode 18 is made of a conductive material such as aluminum and has a substantially disk shape. The lower electrode 18 is electrically connected to the electrode plate 19. A central axis of the lower electrode 18 and the electrode plate 19 substantially coincides with the axis AX.

A channel 18f may be formed in the lower electrode 18. The channel 18f is a channel for a heat exchange medium. As a heat exchange medium, for example, a refrigerant is used. The channel 18f receives a heat exchange medium supplied from a supply device (for example, a chiller unit) through a pipe 23a. The supply device is provided outside the chamber 10. The heat exchange medium from the supply device flows through the channel 18f and returns to the supply device through a pipe 23b.

The electrostatic chuck 20 is provided on the lower electrode 18. When the substrate W is processed in the interior space 10s, the substrate W is placed on the electrostatic chuck 20 such that a center thereof is positioned on the axis AX. The electrostatic chuck 20 is configured to hold the substrate. The electrostatic chuck 20 has a main body and an electrode (chuck electrode). The main body of the electrostatic chuck 20 is made of a dielectric material such as aluminum oxide or aluminum nitride. The main body of the electrostatic chuck 20 has a substantially disk shape. A central axis of the electrostatic chuck 20 substantially coincides with the axis AX.

The electrode of the electrostatic chuck 20 is provided in the main body of the electrostatic chuck 20. The electrode of the electrostatic chuck 20 is a film formed of a conductor. A DC power supply is electrically connected to the electrode of the electrostatic chuck 20. When a DC voltage is applied to the electrode of the electrostatic chuck 20 from the DC power supply, an electrostatic attractive force is generated between the electrostatic chuck 20 and the substrate W. The substrate W is attracted to the electrostatic chuck 20 by the generated electrostatic attractive force and is held by the electrostatic chuck 20.

The substrate support 16 may further support an edge ring ER mounted thereon. The edge ring ER has a ring shape and is made of, for example, silicon or silicon carbide. The edge ring ER is mounted on the substrate support 16 such that a central axis thereof is positioned on the axis AX. In one exemplary embodiment, the edge ring ER may be partially mounted on the electrostatic chuck 20. In addition, the substrate W is disposed on the electrostatic chuck 20 and in a region surrounded by the edge ring ER.

The plasma processing apparatus 1 may further include a gas supply line 25. The gas supply line 25 supplies a heat transfer gas, for example, helium (He) gas, from a gas supply mechanism to a gap between an upper surface of the electrostatic chuck 20 and a rear surface (lower surface) of the substrate W.

The plasma processing apparatus 1 may further include a cylindrical portion 28 and an insulating portion 29. The cylindrical portion 28 extends upward from the bottom of the chamber main body 12. The cylindrical portion 28 extends along an outer circumference of the support 15. The cylindrical portion 28 is made of a conductive material and has a substantially cylindrical shape. The cylindrical portion 28 is electrically grounded. The insulating portion 29 is provided on the cylindrical portion 28. The insulating portion 29 is made of an insulating material. The insulating portion 29 is made of, for example, a ceramic such as quartz. The insulating portion 29 has a substantially cylindrical shape. The insulating portion 29 extends along an outer circumference of the electrode plate 19, an outer circumference of the lower electrode 18, and an outer circumference of the electrostatic chuck 20.

The plasma processing apparatus 1 further includes an upper electrode 30. The upper electrode 30 is provided above the substrate support 16. The upper electrode 30 closes an upper opening of the chamber main body 12 together with a member 32. The member 32 is made of an insulating material. The upper electrode 30 is supported by the member 32 at an upper side of the chamber main body 12.

The upper electrode 30 may include a top plate 34 and a support 36. A lower surface of the top plate 34 defines the interior space 10s. A plurality of gas holes 34a are formed in the top plate 34. The plurality of gas holes 34a pass through the top plate 34 in a plate thickness direction (vertical direction). The top plate 34 is made of, for example, silicon. Alternatively, the top plate 34 may have a structure in which a plasma-resistant film is provided on a surface of an aluminum member. The film may be a ceramic film such as a film formed through anodizing treatment or a film made of yttrium oxide.

The support 36 supports the top plate 34 using a detachable material. The support 36 is made of a conductive material such as aluminum. A gas diffusion chamber 36a is provided inside the support 36. A plurality of gas holes 36b extend downward from the gas diffusion chamber 36a. The plurality of gas holes 36b communicate with the plurality of gas holes 34a. A gas inlet port 36c is formed in the support 36. The gas inlet port 36c is connected to the gas diffusion chamber 36a. A gas supply pipe 38 is connected to the gas inlet port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (for example, an on-off valve). The flow rate controller group 42 includes a plurality of flow rate controllers. Each of the plurality of flow rate controllers in the flow rate controller group 42 is a mass flow controller or a pressure control-type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply a gas from one or more gas sources selected from among the plurality of gas sources of the gas source group 40 to the interior space 10s at an individually adjusted flow rate.

The plasma processing apparatus 1 may further include a baffle member 48. The baffle member 48 is provided between the cylindrical portion 28 and the sidewall of the chamber main body 12. The baffle member 48 may be a plate-shaped member. The baffle member 48 may be formed, for example, by coating an aluminum plate material with a ceramic such as yttrium oxide. A plurality of through holes are formed in the baffle member 48. Below the baffle member 48, an exhaust pipe 52 is connected to the bottom of the chamber main body 12. An exhaust device 50 is connected to the exhaust pipe 52. The exhaust device 50 includes a pressure controller such as an automatic pressure control valve and a vacuum pump such as a turbo molecular pump, thereby reducing pressure in the interior space 10s.

The plasma processing apparatus 1 further includes a high-frequency power supply 61. The high-frequency power supply 61 is a power supply that generates high-frequency power for plasma generation. The high-frequency power supply 61 constitutes a plasma generator according to one exemplary embodiment. A frequency of the high-frequency power may be a frequency in a range of 27 MHz to 100 MHz, for example, a frequency of 40 MHz or 60 MHz. The high-frequency power supply 61 is connected to the lower electrode 18 through a matching unit 61m and the electrode plate 19. The matching unit 61m includes a matching circuit for matching impedance of a load side (lower electrode 18 side) of the high-frequency power supply 61 with output impedance of the high-frequency power supply 61. In addition, the high-frequency power supply 61 may not be electrically connected to the lower electrode 18 and may be connected to the upper electrode 30 through the matching unit 61m.

In the plasma processing apparatus 1, a gas is supplied from a gas supply unit to the interior space 10s. Then, high-frequency power is supplied from the high-frequency power supply 61 to excite gas in the interior space 10s. As a result, plasma is generated in the interior space 10s. The substrate W is processed with chemical species such as ions and/or radicals from the plasma.

Figure 2:
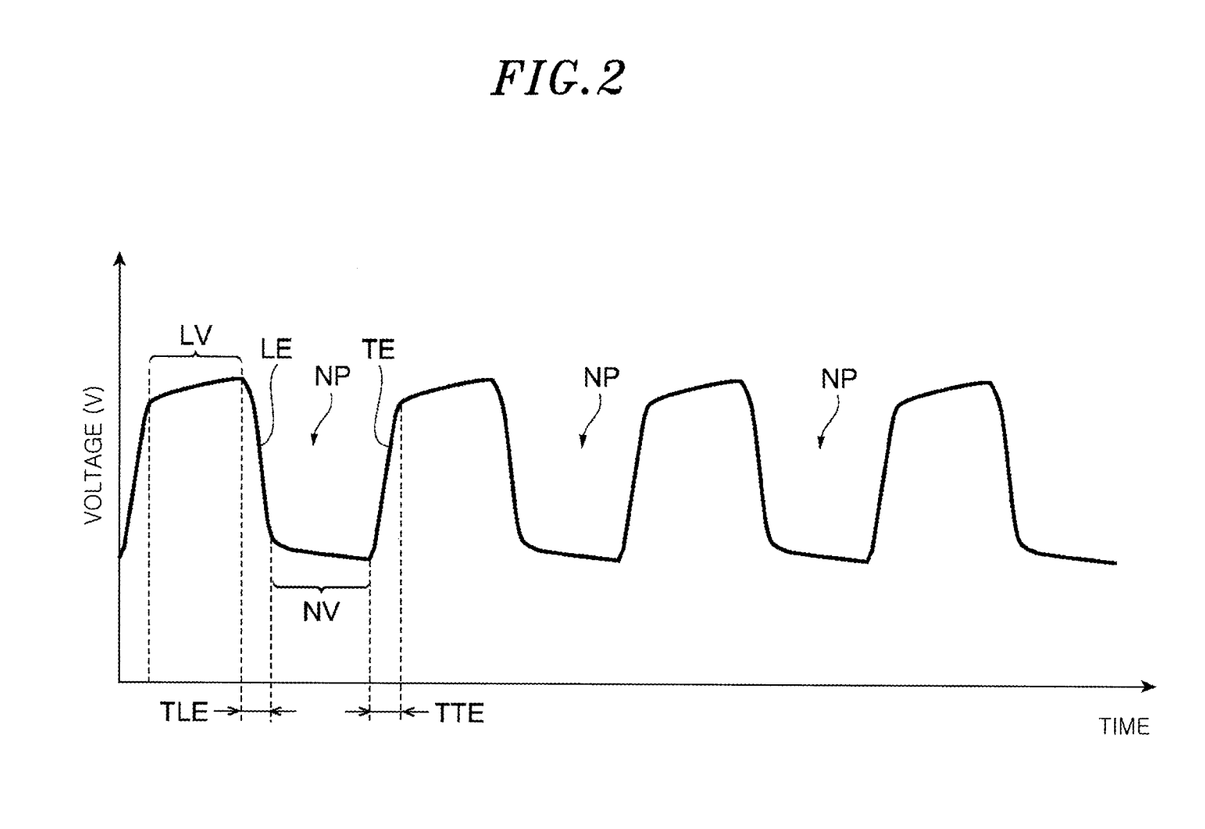
FIG. 2 is a diagram illustrating an example of a waveform of an output voltage of a bias power supply in a plasma processing apparatus according to one exemplary embodiment.

The plasma processing apparatus 1 further includes a bias power supply 70. The bias power supply 70 is electrically connected to a bias electrode. In the example shown in FIG. 1, the lower electrode 18 is used as the bias electrode, and the bias power supply 70 is electrically connected to the lower electrode 18. Hereinafter, FIG. 2 will be referred to together with FIG. 1. FIG. 2 is a diagram illustrating an example of a waveform of an output voltage of a bias power supply in a plasma processing apparatus according to one exemplary embodiment. As shown in FIG. 2, a bias power supply 70 is configured to generate a sequence of a plurality of voltage pulses NP. The bias power supply 70 is configured to apply the sequence of the plurality of voltage pulses NP to a bias electrode (in one example, a lower electrode 18). In one exemplary embodiment, the bias power supply 70 is configured to periodically apply the voltage pulses NP to the bias electrode (in one example, the lower electrode 18). A time interval (that is, a period) during which the voltage pulse NP is applied to the bias electrode has a time length of a reciprocal of a bias frequency. A bias frequency that defines a period in which the voltage pulse NP is applied to the bias electrode may be a frequency of 1 kHz or more and 27 MHz or less, for example, 400 kHz.

In a plasma processing apparatus 1, the energy of ions colliding with the substrate W from plasma is adjusted according to a magnitude of an absolute value of a negative potential of the substrate, which is set in response to the voltage pulse NP being applied to the bias electrode. In one exemplary embodiment, each of the plurality of voltage pulses NP may be a negative voltage pulse. In this case, the energy of ions colliding with the substrate W from plasma is adjusted according to a magnitude of an absolute value of a voltage level of the voltage pulse NP.

As shown in FIG. 2, the voltage pulse NP is a pulse having a leading edge LE and a trailing edge TE. In the leading edge LE, a voltage level of the voltage pulse NP is changed from a reference voltage level LV to a pulse voltage level NV. In the trailing edge TE, a voltage level of the voltage pulse NP is changed from the pulse voltage level NV to the reference voltage level LV. The pulse voltage level NV is a voltage level (for example, a negative voltage level) in a steady state of the voltage pulse NP. When the voltage pulse NP does not have a steady state like a triangular wave, the pulse voltage level NV may be a negative voltage level having a maximum absolute value in the voltage pulse NP. The pulse voltage level NV may be greater than or equal to −20 kV and less than or equal to −0.5 kV. That is, an absolute value of the pulse voltage level NV may be greater than or equal to 0.5 kV and less than or equal to 20 kV. The reference voltage level LV is a level of an output voltage of the bias power supply 70 when the voltage pulse NP is not output. The reference voltage level LV may be 0 V. The reference voltage level LV may be a negative voltage level having an absolute value that is less than an absolute value of the pulse voltage level NV. Alternatively, the reference voltage level LV may be a positive voltage level.

A start time of the leading edge LE is defined as a start time of an output of the voltage pulse NP by the bias power supply 70. An end time of the leading edge LE is defined as a time of occurrence of an inflection point at which an output voltage of the bias power supply 70 is changed from a waveform of the leading edge LE to a waveform (waveform of the pulse voltage level NV) immediately after the leading edge LE. In addition, when the voltage pulse NP does not have a steady state like a triangular wave, the end time of the leading edge LE may be a time at which a negative voltage having a maximum absolute value is generated in the voltage pulse NP.

Furthermore, a start time of the trailing edge TE is defined as a time of occurrence of an inflection point at which an output voltage of the bias power supply 70 is changed from a waveform (waveform of the pulse voltage level NV) immediately before the trailing edge TE to a waveform of the trailing edge TE. In addition, when the voltage pulse NP does not have a steady state like a triangular wave, the start time of the trailing edge TE may be a time at which a negative voltage having a maximum absolute value is generated in the voltage pulse NP. An end time of the trailing edge TE is defined as an end time of output of the voltage pulse NP by the bias power supply 70.

In the voltage pulse NP output by the bias power supply 70, at least one of a time length of a period of the leading edge LE (that is, a leading edge period TLE) and a time length of a period of the trailing edge TE (that is, a trailing edge period TTE) is greater than 0 seconds and less than or equal to 0.5 microseconds. In one exemplary embodiment, at least one of the time length of the leading edge period TLE and the time length of the trailing edge period TTE may be greater than 0 seconds and less than or equal to 0.25 microseconds. In one exemplary embodiment, at least one of the time length of the leading edge period TLE and the time length of the trailing edge period TTE may be greater than or equal to 0.05 microseconds. In one exemplary embodiment, in the voltage pulse NP output by the bias power supply 70, each of the time length of the leading edge period TLE and the time length of the trailing edge period TTE may be greater than or equal to 0.05 microseconds and less than or equal to 0.5 microseconds. In addition, an absolute value of a slope of a time change of a voltage of the leading edge LE is may be greater than or equal to 1 kV/microseconds (=|−0.5 kV/0.5 microseconds|) and less than or equal to 400 kV/microseconds (=|−20 kV/0.05 microseconds|). Furthermore, a slope of a time change of a voltage of the trailing edge TE may be greater than or equal to 1 kV/microseconds and less than or equal to 400 kV/microseconds.

The plasma processing apparatus 1 may further include a control unit MC. The control unit MC is a computer including a processor, a storage device, an input device, a display device, and the like and controls each unit of the plasma processing apparatus 1. Specifically, the control unit MC executes a control program stored in the storage device and controls each unit of the plasma processing apparatus 1 based on recipe data stored in the storage device. Under control of the control unit MC, a predetermined process is executed in the plasma processing apparatus 1 according to the recipe data. A plasma processing method according to an exemplary embodiment to be described below can be executed in the plasma processing apparatus 1 by each unit of the plasma processing apparatus 1 being controlled by the control unit MC.

Figure 3:
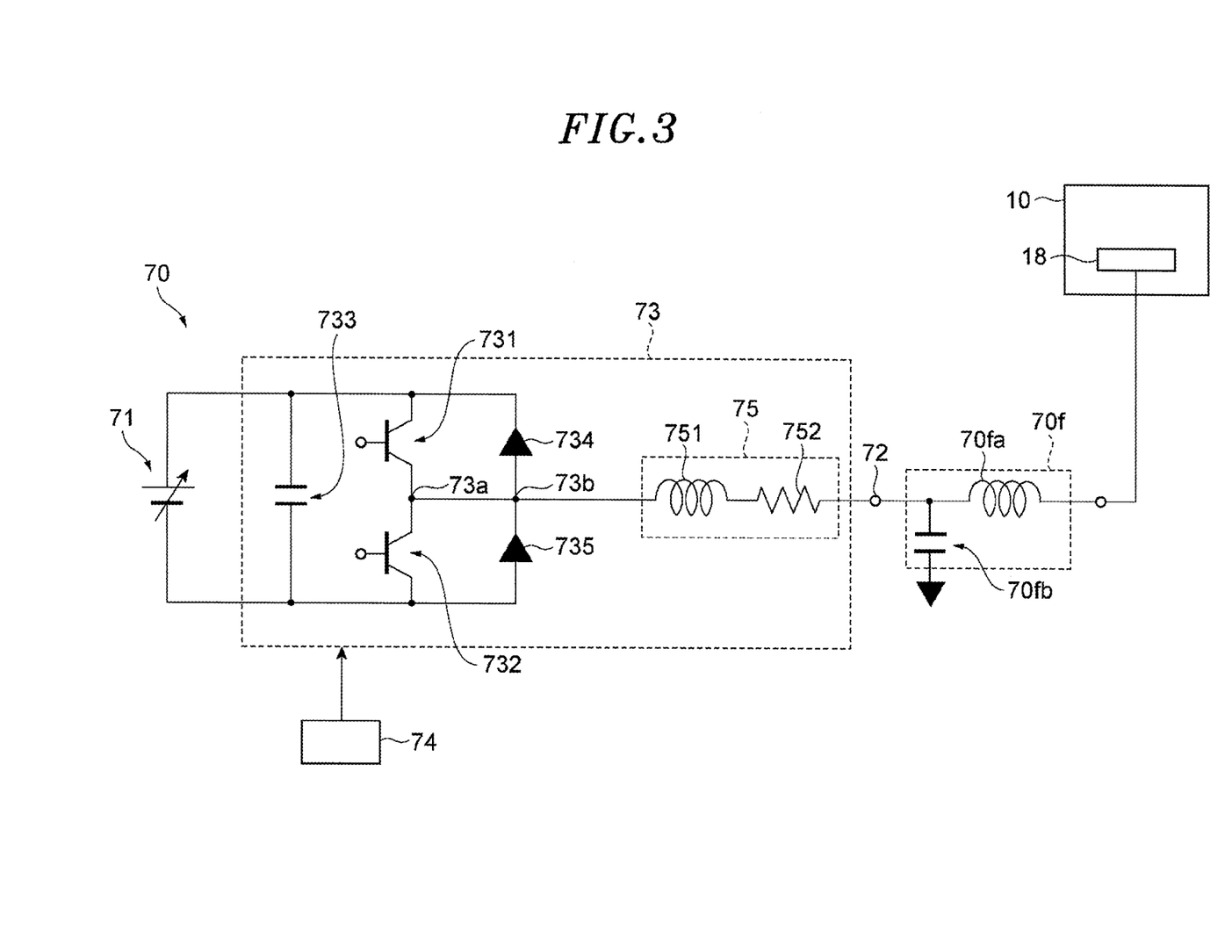
FIG. 3 is a diagram illustrating a bias power supply in a plasma processing apparatus according to one exemplary embodiment.

Hereinafter, FIG. 3 will be referred to. FIG. 3 is a diagram illustrating a bias power supply in a plasma processing apparatus according to one exemplary embodiment. As shown in FIGS. 1 and 3, in one exemplary embodiment, a bias power supply 70 may be connected to a bias electrode (in one example, a lower electrode 18) through a filter 70f. The filter 70f blocks or reduces high-frequency power towards the bias power supply 70. In one exemplary embodiment, the filter 70f may include an inductor 70fa and a capacitor 70fb. The inductor 70fa is connected between the bias electrode (lower electrode 18 in the example of FIG. 1) and the bias power supply 70 (or an output terminal 72 thereof). The capacitor 70fb is connected between a ground and a node disposed between the bias power supply 70 (or the output terminal 72 thereof) and the inductor 70fa.

As shown in FIG. 3, in one exemplary embodiment, the bias power supply 70 may include a DC power supply 71 and a pulse unit 73. The bias power supply 70 may further include the output terminal 72 and a pulse controller 74. The DC power supply 71 is a power supply that generates a DC voltage. A DC voltage generated by the DC power supply 71 may be a negative DC voltage. The DC power supply 71 may be a variable DC power supply. The DC power supply 71 may be controlled by a control unit MC. In the bias power supply 70, a voltage pulse NP is output from the output terminal 72.

The pulse unit 73 is provided between the DC power supply 71 and the output terminal 72 (or the bias electrode). The pulse unit 73 is configured to generate the voltage pulse NP from the DC voltage generated by the DC power supply 71. The pulse unit 73 includes a first switching element 731, a second switching element 732, and an impedance circuit 75. The pulse unit 73 may further include a capacitor 733, a diode 734, and a diode 735.

The first switching element 731 and the second switching element 732 are connected in series between a positive electrode and a negative electrode of the DC power supply 71. Each of the first switching element 731 and the second switching element 732 includes first and second terminals and a control terminal. The first terminal of the first switching element 731 is connected to the positive electrode of the DC power supply 71. The second terminal of the first switching element 731 is connected to the first terminal of the second switching element 732. The second terminal of the second switching element 732 is connected to the negative electrode of the DC power supply 71. When each of the first switching element 731 and the second switching element 732 is closed by a voltage applied to the control terminal thereof, the first terminal and the second terminal thereof are electrically connected. On the other hand, when each of the first switching element 731 and the second switching element 732 is opened by a voltage applied to the control terminal thereof, the electrical connection between the first terminal and the second terminal is disconnected.

The capacitor 733 is connected to be parallel with a series circuit including the first switching element 731 and the second switching element 732 between the positive electrode and the negative electrode of the DC power supply 71. A cathode of the diode 734 is connected to the positive electrode of the DC power supply 71 and the first terminal of the first switching element 731. An anode of the diode 734 and a cathode of diode 735 are connected to a node 73b. The node 73b is connected to a node 73a between the first switching element 731 and the second switching element 732.

An anode of the diode 735 is connected to the negative electrode of the DC power supply 71 and the second terminal of the second switching element 732.

The impedance circuit 75 is connected between the node 73a (or the node 73b) and the output terminal 72 (or the bias electrode). In one exemplary embodiment, the impedance circuit 75 may include an inductor 751 and a resistance element 752. The inductor 751 and the resistance element 752 are connected in series between the node 73a (or the node 73b) and the output terminal 72 (or the bias electrode). The resistance element 752 may have a small resistance value of about several ohms.

The pulse controller 74 is configured to control the pulse unit 73. The pulse controller 74 may include a programmable processor. The pulse controller 74 is configured to alternately perform a first control and a second control. In the first control, the pulse controller 74 provides a control signal to the control terminal of the first switching element 731 and the control terminal of the second switching element 732 so as to close the first switching element 731 and open the second switching element 732. As a result of the first control, the output terminal 72 is connected to the positive electrode of the DC power supply 71. In the second control, the pulse controller 74 provides a control signal to the control terminal of the first switching element 731 and the control terminal of the second switching element 732 so as to open the first switching element 731 and close the second switching element 732. As a result of the second control, the output terminal 72 is connected to the negative electrode of the DC power supply 71.

A frequency that defines a period in which the voltage pulse NP is applied to the bias electrode (in one example, the lower electrode 18), that is, a bias frequency, may be designated in the pulse controller 74 by the control unit MC. A ratio of a time length of the voltage pulse NP to the period, that is, a duty ratio (%), may also be designated in the pulse controller 74 by the control unit MC. The pulse controller alternately performs the first control and the second control so as to generate the voltage pulse NP periodically in a period (that is, a time interval) having a time length that is a reciprocal of the designated frequency. Furthermore, the pulse controller 74 adjusts a time length of each of the first control and the second control according to the designated duty ratio. According to such a bias power supply 70, as shown in FIG. 2, the voltage pulse NP may be periodically applied to the bias electrode (in one example, the lower electrode 18).

When the voltage pulse NP applied to the bias electrode is a perfect rectangular pulse, it is possible to control the energy of ions colliding with a substrate W, but for that reason, costs become high. According to the voltage pulse NP having at least one of the leading edge period TLE and the trailing edge period TTE described above, it is possible to control the energy of ions colliding with the substrate W as in the case of using a perfect rectangular pulse. In addition, when each of a time length of the leading edge period TLE and a time length of the trailing edge period TTE is greater than or equal to 0.05 seconds, ringing in the voltage pulse NP can be suppressed or reduced.

Figure 4:
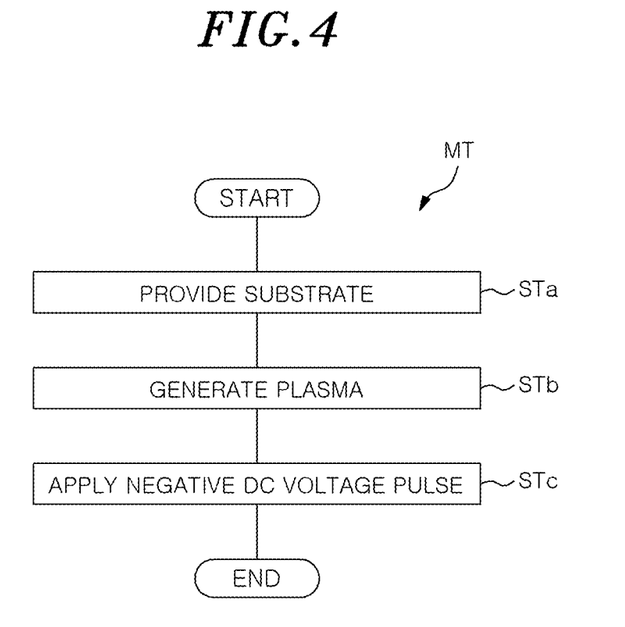
FIG. 4 is a flowchart of a plasma processing method according to one exemplary embodiment.

Hereinafter, a plasma processing method according to one exemplary embodiment will be described with reference to FIG. 4 by exemplifying a case of being applied to the plasma processing apparatus 1 shown in FIG. 1. FIG. 4 is a flowchart of the plasma processing method according to one exemplary embodiment.

The plasma processing method shown in FIG. 4 (hereinafter, referred to as "method MT") is started in operation STa. In operation STa, a substrate W is provided. The substrate W is placed on a substrate support 16 in a chamber 10 of the plasma processing apparatus 1.

In subsequent operation STb, plasma is generated in the chamber 10. In operation STb, a gas is supplied into the chamber from a gas supply unit. In operation STb, an exhaust device 50 adjusts a pressure of the gas in the chamber 10 to a designated pressure. In operation STb, a plasma generator generates plasma from the gas in the chamber 10. In the plasma processing apparatus 1, high-frequency power is supplied from a high-frequency power supply 61 in order to generate plasma. In operation STb, a control unit MC controls the gas supply unit, the exhaust device 50, and the plasma generator (high-frequency power supply 61).

Subsequent operation STc is performed in a state in which the plasma is generated in the chamber 10 in operation STb. In operation STc, a sequence of a plurality of voltage pulses NP is applied from a bias power supply 70 to a bias electrode (in one example, a lower electrode 18). As described above, at least one of a time length of a leading edge period TLE and a time length of a trailing edge period TTE of the voltage pulse NP is greater than 0 seconds and less than or equal to 0.5 microseconds. In one exemplary embodiment, at least one of the time length of the leading edge period TLE and the time length of the trailing edge period TTE may be greater than 0 seconds and less than or equal to 0.25 microseconds. In one exemplary embodiment, at least one of the time length of the leading edge period TLE and the time length of the trailing edge period TTE may be greater than or equal to 0.05 microseconds. In one exemplary embodiment, in the voltage pulse NP output by the bias power supply 70, the time length of the leading edge period TLE and the time length of the trailing edge period TTE may each be greater than or equal to 0.05 microseconds and less than or equal to 0.5 microseconds. In operation STc, the bias power supply 70 may be controlled by a control unit MC.

Hereinafter, simulations performed for evaluation of a plasma processing apparatus 1 will be described.

(First Simulation) In a first simulation, an ion energy distribution (IED) of ions colliding with a substrate was obtained by changing a time length of a leading edge period TLE of a voltage pulse NP applied to a lower electrode 18. A bias frequency defining a period, in which the voltage pulse NP was applied to the lower electrode 18, was 400 kHz, and a duty ratio of the voltage pulse NP was 50%. The time lengths of the leading edge period TLE were 0 microseconds, 0.25 microseconds, 0.5 microseconds, 0.75 microseconds, 1 microsecond, and 1.25 microseconds. When the time length of the leading edge period TLE is 0 microseconds, a waveform of the voltage pulse NP is a perfect rectangular wave. Furthermore, for reference, when high-frequency bias power having a frequency of 400 kHz was supplied to the lower electrode 18 instead of the voltage pulse NP, an IED of ions colliding with the substrate was obtained.

Figure 5:
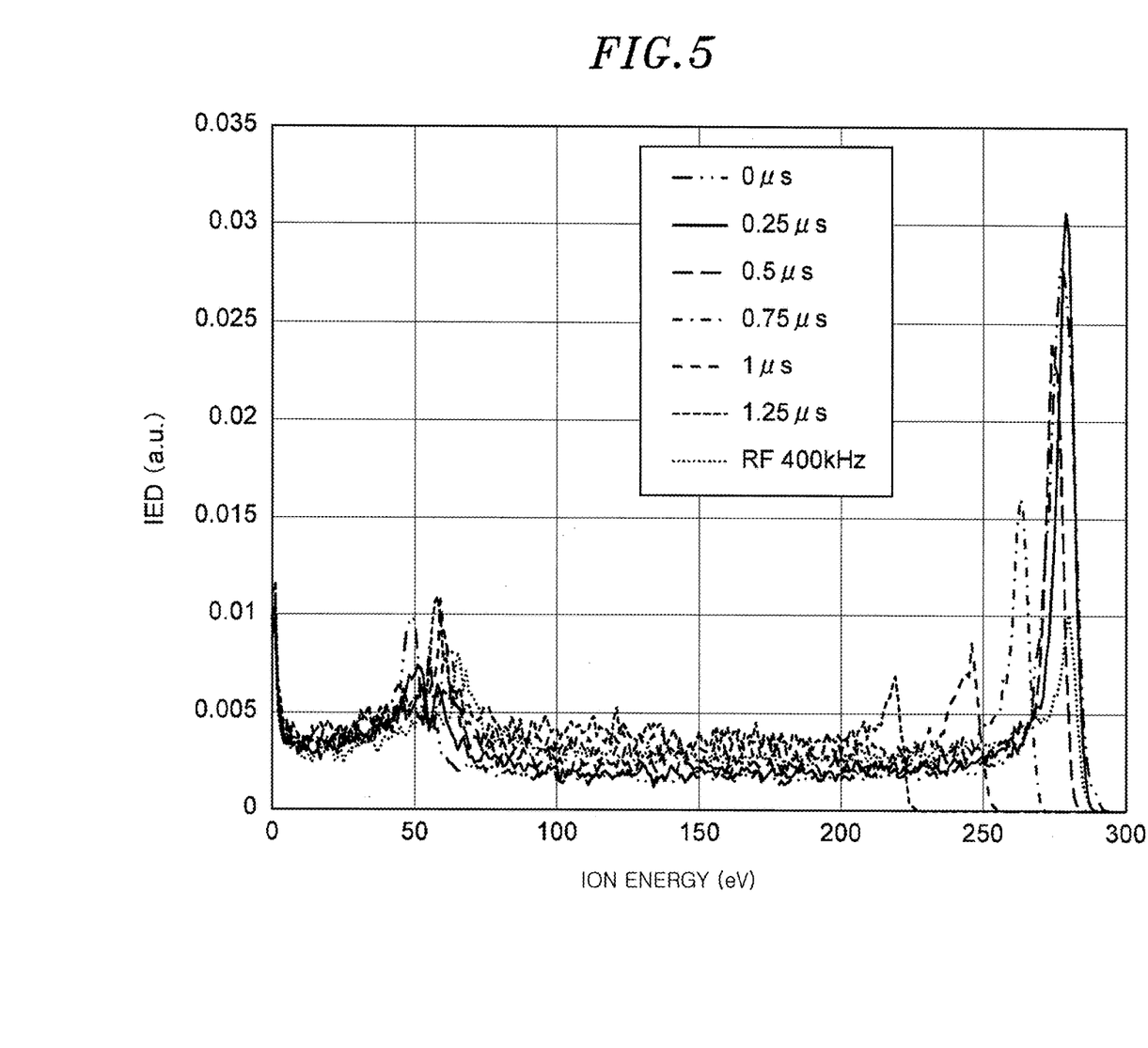
FIG. 5 is a graph showing the results of a first simulation.

FIG. 5 shows results of the first simulation. As shown in FIG. 5, it was confirmed that ion energy tended to be decreased as the time length of the leading edge period TLE was increased. However, when the time length of the leading edge period TLE was less than or equal to 0.5 microseconds, it was confirmed that it was possible to enable ions, which have substantially the same energy as the energy of ions colliding with the substrate when a perfect rectangular wave is used, to collide with the substrate. Furthermore, it was confirmed that a peak of an IED of ions colliding with the substrate when the time length of the leading edge period TLE was less than or equal to 0.5 microseconds was considerably higher than a peak of an IED of ions colliding with the substrate when high-frequency bias power (with RF 400 kHz in FIG. 5) was supplied.

(Second Simulation) In a second simulation, an ion angle distribution (IAD) with respect to a substrate when ions collided with the substrate was obtained by changing a time length of a leading edge period TLE of a voltage pulse NP applied to a lower electrode 18. A bias frequency defining a period, in which the voltage pulse NP was applied to the lower electrode 18, was 400 kHz, and a duty ratio of the voltage pulse NP was 50%. The time lengths of the leading edge period TLE were 0 microseconds, 0.25 microseconds, 0.5 microseconds, 0.75 microseconds, 1 microsecond, and 1.25 microseconds. Furthermore, for reference, when high-frequency bias power having a frequency of 400 kHz was supplied to the lower electrode 18 instead of the voltage pulse NP, an IAD with respect to the substrate when ions collided with the substrate was obtained.

Figure 6:
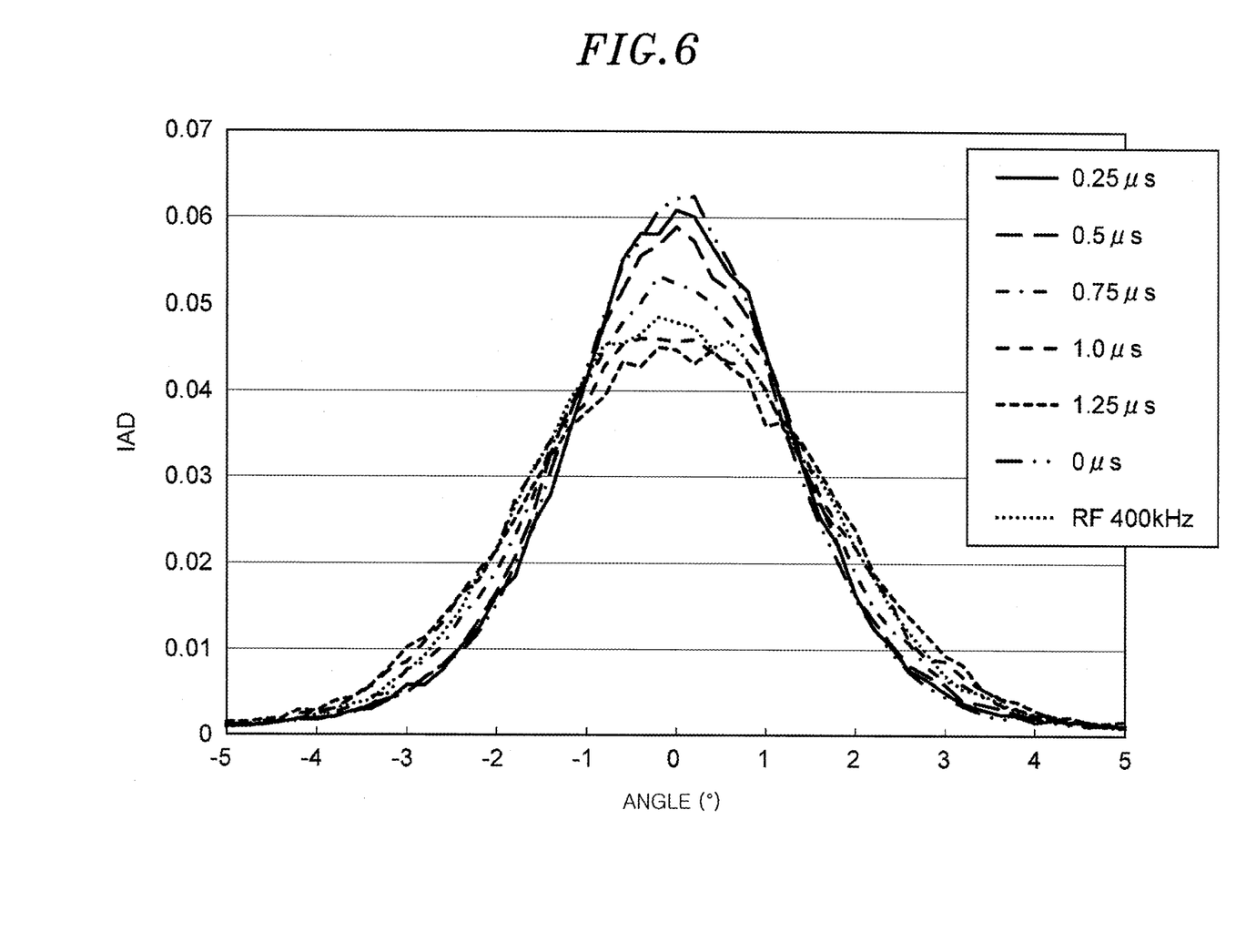
FIG. 6 is a graph showing the results of a second simulation.

FIG. 6 shows results of the second simulation. FIG. 6 shows that ions perpendicularly collide with the substrate when an angle is 0°. As shown in FIG. 6, it was confirmed that an IAD, at which ions collided with a substrate W, tended to be increased as the time length of the leading edge period TLE was increased. However, when the time length of the leading edge period TLE was less than or equal to 0.5 microseconds, an IAD similar to an IAD when a perfect rectangular wave was used was obtained. That is, when the time length of the leading edge period TLE was less than or equal to 0.5 microseconds, it was confirmed that ions substantially perpendicularly collided with the substrate, and an IAD when the ions collided with the substrate was narrow.

(Third Simulation) In a third simulation, an ion energy distribution (IED) of ions colliding with a substrate was obtained by changing a voltage level (voltage between a leading edge LE and a trailing edge TE) in a steady state of a voltage pulse NP applied to a lower electrode 18. The voltage levels in the steady state of the voltage pulse NP applied to the lower electrode 18 were −450 V, −900 V, and −1,350 V. In addition, a bias frequency defining a period, in which the voltage pulse NP was applied to the lower electrode 18, was 400 kHz, and a duty ratio of the voltage pulse NP was 20%. In addition, a time length of each of a leading edge period TLE and a trailing edge period TTE was 0.3 microseconds.

Figure 7:
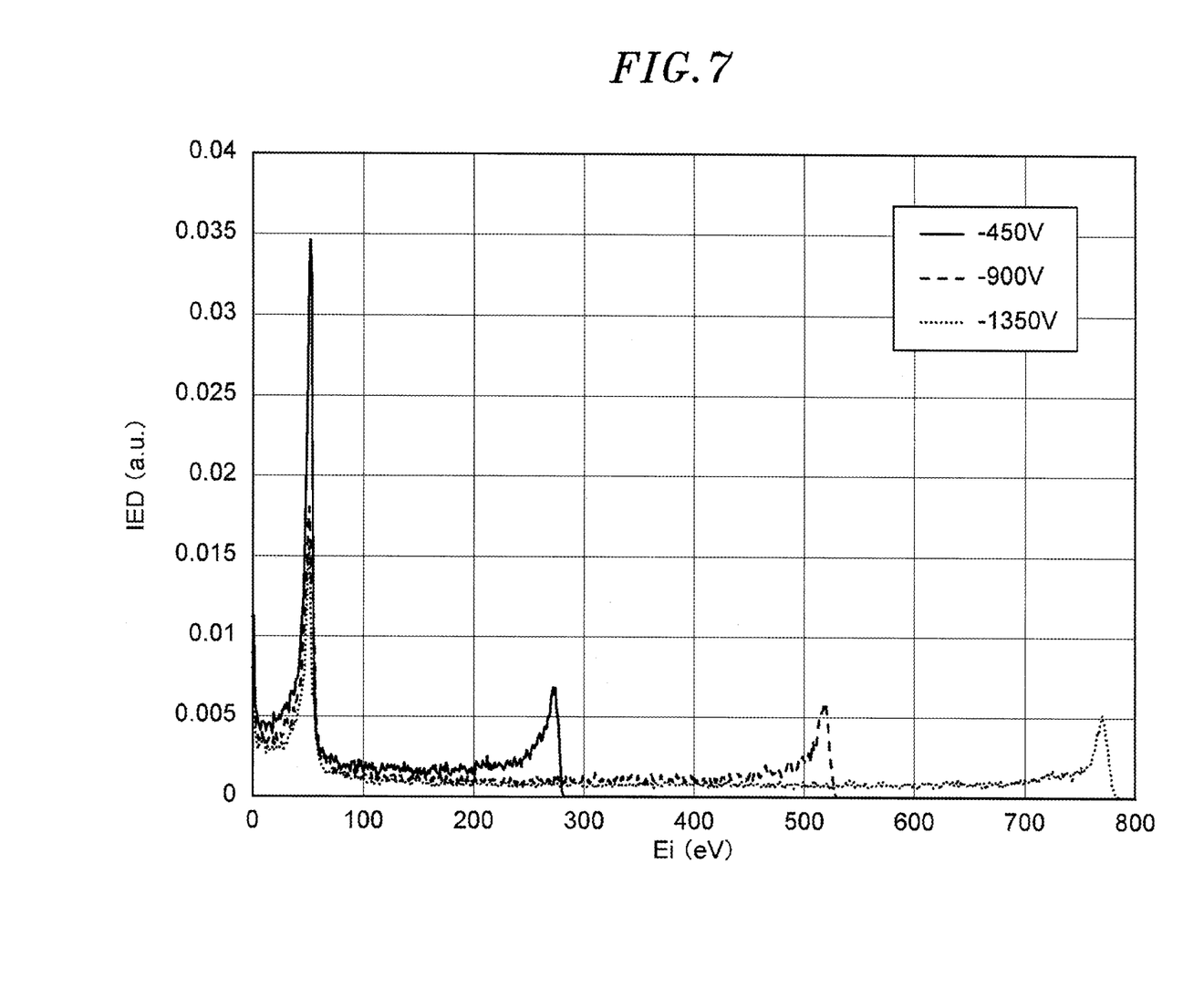
FIG. 7 is a graph showing the results of a third simulation.

FIG. 7 shows results of the third simulation. As shown in FIG. 7, it was confirmed that peak ion energy in an IED was increased according to a magnitude of an absolute value of a voltage level in a steady state of the voltage pulse NP applied to the lower electrode 18, that is, a bias electrode. Therefore, it was confirmed that it was possible to control the energy of ions colliding with the substrate by controlling a voltage level in the steady state of the voltage pulse NP applied to the lower electrode 18.

Although various exemplary embodiments have been described above, the present disclosure is not limited to the exemplary embodiments described above, and various additions, omissions, substitutions, and changes may be made. In addition, elements in different exemplary embodiments may be combined to form other exemplary embodiments.

In another exemplary embodiment, a positive voltage pulse may be applied to a bias electrode. Even when a positive voltage pulse is applied to the bias electrode, it is possible to control the energy of ions colliding with a substrate by a potential difference between a potential of the bias electrode and a plasma potential.

Figure 8:
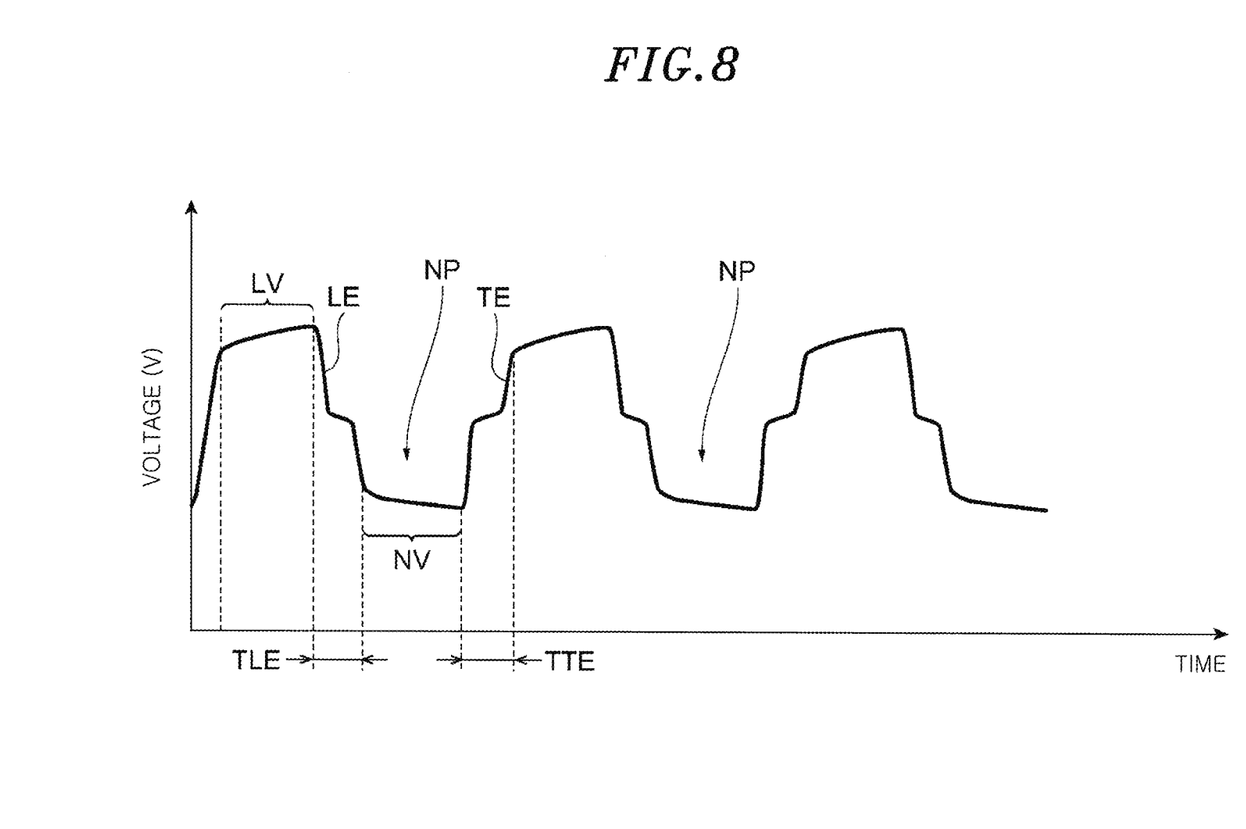
FIG. 8 is a diagram illustrating another example of a waveform of an output voltage of a bias power supply in a plasma processing apparatus according to one exemplary embodiment.

FIG. 8 is a diagram illustrating another example of a waveform of an output voltage of a bias power supply in a plasma processing apparatus according to one exemplary embodiment. As shown in FIG. 8, each of a plurality of voltage pulse NP may transition to at least one different level between a reference voltage level LV and a pulse voltage level NV during at least one period of a leading edge period TLE and a trailing edge period TTE. In the leading edge period TLE, before a voltage of each of the plurality of voltage pulses NP transitions from the reference voltage level LV to the pulse voltage level NV, a pulse unit 73 may open a switching element 731 and a second switching element 732 so as to float a potential of a bias electrode for a certain period of time. In the trailing edge period TTE, before a voltage of each of the plurality of voltage pulses NP transitions from the pulse voltage level NV to the reference voltage level LV, the pulse unit 73 may open the switching element 731 and the second switching element 732 so as to float a potential of the bias electrode for a certain period of time.

In another exemplary embodiment, the plasma processing apparatus including a bias power supply 70 may be another type of plasma processing apparatus other than a capacitively coupled plasma processing apparatus. Another type of plasma processing apparatus may be an inductively coupled plasma processing apparatus, an electron cyclotron resonance (ECR) plasma processing apparatus, or a plasma processing apparatus which generates plasma using surface waves such as microwaves. In a plasma processing method according to various exemplary embodiments, such another type of plasma processing apparatus may be used.

Moreover, in another exemplary embodiment, a lower electrode 18 may not be used as a bias electrode. In this case, a substrate support 16 may include one or more bias electrodes provided in a main body of an electrostatic chuck 20.

In one exemplary embodiment, at least one bias electrode may be provided in a first region of the electrostatic chuck 20 on which a substrate is placed. At least one bias electrode may be provided between a chuck electrode and the lower electrode 18 in the first region. Alternatively, at least one bias electrode may be the chuck electrode of the electrostatic chuck 20. The bias power supply 70 is electrically connected to at least one bias electrode and is configured to apply a voltage pulse NP to the at least one bias electrode.

At least one bias electrode may extend in a second region of the electrostatic chuck 20, on which an edge ring ER is mounted. Alternatively, at least one bias electrode may include at least one other bias electrode provided in the second region. The at least one other bias electrode may be another chuck electrode provided to generate an electrostatic attractive force for holding the edge ring ER or may be an electrode provided separately from the another chuck electrode. The another chuck electrode may be a chuck electrode constituting a unipolar type electrostatic chuck or may be a chuck electrode constituting a bipolar type electrostatic chuck. The bias power supply 70 may be electrically connected to at least one other bias electrode in the second region in addition to the at least one bias electrode in the first region.

From the above description, it will be understood that various exemplary embodiments of the present disclosure have been described in this specification for purposes of description and that various modifications can be made without departing from the scope and gist of the present disclosure. Therefore, the various exemplary embodiments disclosed in this specification are not intended to limit the present disclosure, and the true scope and gist are shown by the appended claims.

The invention claimed is:

1. A plasma processing apparatus comprising:
 a chamber;
 a substrate support provided in the chamber, the substrate support including a bias electrode;
 a plasma generator configured to generate plasma from a gas in the chamber; and
 a bias power supply electrically connected to the bias electrode and configured to generate a sequence of a plurality of voltage pulses applied to the bias electrode,
 wherein each of the plurality of voltage pulses has a leading edge period in which the voltage pulse transitions from a reference voltage level to a pulse voltage level and a trailing edge period in which the voltage pulse transitions from the pulse voltage level to the reference voltage level, and at least one of a time length of the leading edge period and a time length of the trailing edge period is greater than 0 seconds and less than or equal to 0.5 microseconds.

2. The plasma processing apparatus of claim 1, wherein the at least one of the time length of the leading edge period and the time length of the trailing edge period is greater than 0 seconds and less than or equal to 0.25 microseconds.

3. The plasma processing apparatus of claim 1, wherein the at least one of the time length of the leading edge period and the time length of the trailing edge period is greater than or equal to 0.05 microseconds.

4. The plasma processing apparatus of claim 1, wherein each of the plurality of voltage pulses transitions to at least one different voltage level between the reference voltage level and the pulse voltage level during at least one of the leading edge period and the trailing edge period.

5. The plasma processing apparatus of claim 1, wherein each of the plurality of voltage pulses is a negative voltage pulse.

6. The plasma processing apparatus of claim 5, wherein the pulse voltage level is greater than or equal to −20 kV and less than or equal to −0.5 kV.

7. The plasma processing apparatus of claim 5, wherein the reference voltage level is 0 V.

8. The plasma processing apparatus of claim 1, wherein the bias power supply is configured to periodically apply the plurality of voltage pulses to the bias electrode.

9. The plasma processing apparatus of claim 1, wherein the bias power supply includes:
 a direct current (DC) power supply; and
 a pulse unit provided between the DC power supply and the bias electrode, and
 wherein the pulse unit includes:
 a first switching element and a second switching element connected in series between a positive electrode and a negative electrode of the DC power supply; and
 an impedance circuit connected between the bias electrode and a node between the first switching element and the second switching element.

10. The plasma processing apparatus of claim 9, further comprising a pulse controller configured to control the pulse unit,
 wherein the pulse controller is configured to alternately perform a first control that closes the first switching element and opens the second switching element and a second control that opens the first switching element and closes the second switching element.

11. The plasma processing apparatus of claim 9, wherein the impedance circuit includes an inductor and a resistor element connected in series between the node and the bias electrode.

12. The plasma processing apparatus of claim 1, wherein the plasma generator includes a high-frequency power supply.

13. A plasma processing method comprising:
 providing a substrate on a substrate support in a chamber of a plasma processing apparatus;
 generating plasma in the chamber; and
 applying a sequence of a plurality of voltage pulses to the substrate support in a state in which the plasma is generated in the chamber,
 wherein each of the plurality of voltage pulses has a leading edge period in which the voltage pulse transitions from a reference voltage level to a pulse voltage level and a trailing edge period in which the voltage pulse transitions from the pulse voltage level to the reference voltage level, and at least one of a time length of the leading edge period and a time length of the trailing edge period is greater than 0 seconds and less than or equal to 0.5 microseconds.

14. A plasma processing apparatus comprising:
a chamber;
a substrate support provided in the chamber, the substrate support including a bias electrode;
a plasma generator configured to generate plasma from a gas in the chamber; and
a bias power supply electrically connected to the bias electrode and configured to generate a sequence of a plurality of voltage pulses applied to the bias electrode, wherein the bias power supply includes a direct current (DC) power supply and a pulse unit provided between the DC power supply and the bias electrode, and
the pulse unit includes a first switching element and a second switching element connected in series between a positive electrode and a negative electrode of the DC power supply, and an impedance circuit connected between the bias electrode and a node between the first switching element and the second switching element.

15. The plasma processing apparatus of claim 14, further comprising a pulse controller configured to control the pulse unit,
wherein the pulse controller is configured to alternately perform a first control that closes the first switching element and opens the second switching element and a second control that opens the first switching element and closes the second switching element.

16. The plasma processing apparatus of claim 14, wherein the impedance circuit includes an inductor and a resistor element connected in series between the node and the bias electrode.

* * * * *